(12) United States Patent
Roeven (10) Patent No.: US 8,575,935 B2
(45) Date of Patent: Nov. 5, 2013

(54) CLOCK GENERATION IN MRI RECEIVERS

(75) Inventor: Henricus Gerardus Roeven, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 608 days.

(21) Appl. No.: 12/746,785

(22) PCT Filed: Dec. 4, 2008

(86) PCT No.: PCT/IB2008/055085
§ 371 (c)(1),
(2), (4) Date: Jun. 8, 2010

(87) PCT Pub. No.: WO2009/074924
PCT Pub. Date: Jun. 18, 2009

(65) Prior Publication Data
US 2010/0260293 A1    Oct. 14, 2010

(30) Foreign Application Priority Data

Dec. 11, 2007  (EP) ..................................... 07122849

(51) Int. Cl.
*G01V 3/00*  (2006.01)
(52) U.S. Cl.
USPC ......................................................... 324/322
(58) Field of Classification Search
USPC ................................................. 324/300–322
See application file for complete search history.

(56) References Cited

U.S. PATENT DOCUMENTS

| | | | |
|---|---|---|---|
| 4,879,514 A | 11/1989 | Mehlkopf et al. | |
| 5,529,068 A * | 6/1996 | Hoenninger et al. | 600/413 |
| 6,046,591 A * | 4/2000 | King et al. | 324/309 |
| 6,339,717 B1 | 1/2002 | Baumgartl et al. | |
| 6,621,433 B1 | 9/2003 | Hertz | |
| 6,633,162 B2 * | 10/2003 | Zhang et al. | 324/322 |
| 6,977,502 B1 | 12/2005 | Hertz | |
| 2007/0176601 A1 | 8/2007 | Adachi | |
| 2007/0224698 A1 | 9/2007 | Jesmanowicz | |
| 2010/0259261 A1 * | 10/2010 | Saes et al. | 324/309 |

FOREIGN PATENT DOCUMENTS

| | | |
|---|---|---|
| GB | 2290875 A | 1/1996 |
| WO | 2005024448 A1 | 3/2005 |
| WO | 2006048816 A1 | 5/2006 |

OTHER PUBLICATIONS

Viscor et al: "Two-Channel Digital Receiver as a Measurement Unit"; Proceedings of the Radioelektronika Scientific Conference, Bratislava, Sep. 2000, pp. 32-35.

* cited by examiner

*Primary Examiner* — Dixomara Vargas (57) ABSTRACT

The invention relates to a nuclear magnetic resonance imaging radio frequency receiver, the receiver being adapted to receive analogue signals from at least one radio frequency receiver coil unit (122; 204; 306), the radio frequency receiver comprising an analogue-digital converter (408) to convert the analogue magnetic resonance signal into a first digital signal, a resampling and demodulation unit (414) to convert the first digital signal into a second digital signal, a communication interface (400: 600; 602) adapted for transmitting the second digital signal via a communication link (202), and a first clock generator (406) for generating a sampling clock, the sampling clock being the direct clock source for the analogue-digital converter (408), the first clock generator (406) being adapted to generate the sampling clock using a digital timing reference, the digital timing reference being received digitally via the communication link (202) by the communication interface (400: 600; 602), wherein the receiver further comprises a second clock generator (410) for generating a system clock, the system clock being the direct clock source for the resampling and demodulation unit (414), the second clock generator (410) being adapted to generate the system clock using the sampling clock.

16 Claims, 7 Drawing Sheets

CLOCK GENERATION IN MRI RECEIVERS

TECHNICAL FIELD

The invention relates to a nuclear magnetic resonance imaging radio frequency receiver, a method of receiving a radio frequency signal from a magnetic resonance imaging receiver coil unit and a computer program product.

BACKGROUND AND RELATED ART

Magnetic resonance imaging (MRI) is a state of the art imaging technology which allows cross sectional viewing of objects like a human body with unprecedented tissue contrast. MRI is based on the principles of nuclear magnetic resonance (NMR), a spectroscopic technique used by scientists to obtain microscopic chemical and physical information about molecules. The basis of both NMR and MRI is the fact, that atomic nuclei with non-zero spin have a magnetic moment. In medical imaging it is usually nuclei of hydrogen atoms (i.e. protons $^1$H) which are studied since they are present in the body in high concentrations like for example as water. Radio frequency waves are directed at the nuclei in strong external magnetic fields, which lead to an excitation of the protons and a relaxing of the protons. Due to the relaxation of the protons, radio signals are emitted which can be detected and computer processed to form an image. Magnetic resonance (MR) radio frequency (RF) receive coils are necessary parts to receive said RF signals transmitted in a particular MR experiment. The best antenna element location is close to the human body being scanned and therefore most of the MR receive coils are positioned on the patient by a scanner operator.

Since MR receive coils or in general MR receive chains comprising the coils and various electronic components like amplifiers, switches etc, are highly sensitive to disturbances by external radio frequency waves, said MR receive chains have to be electromagnetically shielded which requires the spatial separation of the MR receive chains in an examination room and the control system in a separate technical room.

Current state of the art MR receive chains feature a massive parallel analogue solution with many expensive analogue design elements such as RF switches, RF amplifiers, RF power supplies, RF cables and RF connectors etc. All these components are typically strewn over a distance of 10-20 meters between the receive chain in the exam room and the analogue to digital converters in a technical room, which makes it one of the most complex and challenging aspects to cost effectively design and produce an MR scanner due to component spread and unwanted interactions between the many galvanic parts.

These problems become even more severe in the case of higher element counts in coils, i.e. coil systems comprising multiple individual coils which need to be effectively combined using a state of the art wire technology. Also, in MRI systems each galvanic wire needs draping considerations and careful design to avoid image quality detrimental effects due to galvanic wiring coupling effects.

Also, the actual workflow effectiveness of a particular coil implementation is very important to the MR scanner's operation since it determines in a large part the patient throughput of the MR scanner. Furthermore, a patient benefits from receive coils that have improved patient comfort which is mainly determined by efficient workflow like potentially a shorter or lesser claustrophobic experience and an ergonomic design that reduces cable clutter, that adapts more flexibly to different body shapes and is more lightweight.

These issues can be addressed using a digital interface for a receive coil. In this case, analogue to digital conversion is performed already within the coil. Connector and cable size and handling issues even for high element counts in coils can be overcome by effectively combining multiple elements information to just a few optical fibers or galvanic wires.

U.S. Pat. No. 6,339,717 B1 discloses a medical examination system, particularly a magnetic resonance system comprising a host computer unit, a control computer unit and an image computer unit. Analogue to digital converters are arranged close to the radio frequency coils of the image signal reception system, where the examination system is fashioned as a magnetic resonance system.

U.S. Pat. No. 4,879,514 discloses an MRI device comprising a transmitter/receiver which, with the exception of a few components is all digital.

Digitization remote from the technical room requires the availability of the system (master) clock at the local (remote) analogue to digital converter for appropriate digital sampling, e.g. on the board of the receiver coil. This means, that the information of the master system clock has to be provided from the technical room to the receiver elements in the examination room.

US 2007/0224698 A1 discloses a magnetic resonance imaging system which is adapted for direct digitization of NMR signals.

WO 2007/043009 A2 discloses a radio frequency antenna comprising a resonant pickup circuit arranged to pick up magnetic resonance signals, and an analogue to digital converter arranged to convert the magnetic resonance signals to digital data and a frequency converter arranged to convert a primary band of frequencies of the digital data.

SUMMARY OF THE INVENTION

The present invention provides a nuclear magnetic resonance imaging radio frequency receiver, the receiver being adapted to receive analogue signals from at least one radio frequency receive coil unit, the radio frequency receiver comprising an analogue digital converter to convert the analogue magnetic resonance signal into a first digital signal, a resampling and digital demodulation unit to convert the first digital signal into a second digital signal, a communication interface adapted for transmitting the second digital signal via a communication link, and a first clock generator for generating a sampling clock. The sampling clock is the direct clock source for the analogue digital converter, the first clock generator is adapted to generate the sampling clock using a digital timing reference and the digital timing reference is received digitally via the communication link by the communication interface. The receiver further comprises a second clock generator for generating a system clock, the system clock being the direct clock source for the resampling and digital demodulation unit and the second clock generator is adapted to generate the system clock using the sampling clock.

Since the sampling clock, generated for example by means of a voltage controlled crystal oscillator (VCXO), is the direct clock source for the analogue digital converter and the sampling clock is directly generated from the digital timing reference which is received digitally via the communication link, the clock which is used for the analogue digital converter has the highest accuracy with lowest jitter achievable within the clock system of the receiver. This is important since the quality of the digitized signal depends strongly on the quality of the ADC sampling clock. With the receiver according to the invention a high quality analogue to digital conversion can be provided.

In accordance with an embodiment of the invention, the receiver further comprises a third clock generator for generating a data clock, the data clock being the direct clock source for the communication interface, the third clock generator being adapted to generate the data clock using the sampling clock or the system clock. This means, that the system clock and the data clock are generated based on the sampling clock. As already mentioned above, a high quality of the ADC sampling clock significantly enhances the quality of an acquired RF signal in an MR receiver. Hence, the first choice is to generate the sampling clock directly from the digital timing reference received digitally via the communication link and based upon said sampling clock generating the system clock and the data clock. Increased jitter of the system clock is much less critical than jitter on the sampling clock, because it concerns digital processing only. For comparison, typically for the precision with respect to jitter and phase noise of the clocks the demand for the ADC clock is 1-10 ps and for the system clock 100-500 ps.

In accordance with an embodiment of the invention, the first clock generator and the third clock generator form a feedback loop, wherein the first clock generator is controlled by the feedback loop. Alternatively, the second clock generator can also be comprised in the feedback loop. Using the feedback loop has the advantage, that both sampling clock and system clock are in constant frequency lock with respect to the central timing reference and hence all (remote) MRI receivers in the system operate in a synchronous fashion, allowing central real time (software) control of all receivers.

In accordance with an embodiment of the invention, the feedback loop is a phase locked loop. In all embodiments, by having the VCXO based sampling clock as the direct clock source for the ADC sampling process, any circuit which could possibly add phase noise to the sampling clock is eliminated.

In accordance with an embodiment of the invention, the digital timing reference which is received digitally via the communication link is received as a serial bitstream.

In accordance with an embodiment of the invention, the data clock is a multi phase clock, wherein the communication interface is adapted for a recovery of the data clock from the multi-phase clock, wherein the recovered data clock is usable to recover the data comprised in the serial data bitstream.

For example, the basis for data clock recovery of the communication link is an eight phase clock at the frequency of the serial data rate. The data receiver samples the data with one of the eight clock phases and adjusts the chosen phase dynamically. This way, the data recovery will work even if the local reference clock is not frequency locked to the data rate. The data is then 'deserialized' and the clock divided accordingly. This is then the 'recovered data clock'.

In accordance with an embodiment of the invention, the receiver comprises multiple communication interfaces, the multiple communication interfaces being adapted for daisy chaining of further receivers. A daisy chaining can be performed up to a limit determined by the bandwidth of the used communication links and an almost arbitrary number of receivers and coils can be connected to a signal output fiber link. Daisy chaining reduces the length of internal wiring and even allows getting rid of wires completely in some cases. Using MR receivers equipped with wireless data transmission techniques further enables to reduce wirings.

In accordance with an embodiment of the invention, each communication interface comprises an individually assigned multi-phase clock.

In accordance with an embodiment of the invention, the system clock and the sampling clock run at the same frequency. This has the advantage, that the resampling function can be abandoned. For example, is the case of a 1.5 T proton MRI system, the sampling clock and system clock are both at 50 MHz and the PLL for generating the system clock from the sampling clock can be bypassed.

In another aspect, the invention relates to a nuclear magnetic resonance imaging system comprising a receiver according to the invention and a control and data acquisition system, wherein the control and data acquisition system comprises a master clock, the master clock providing the timing reference to the receiver via the communication link. This allows separating the nuclear magnetic resonance imaging system into receiver parts located in an examination room and control and data acquisition system in a technical room, wherein the receiver and the control and data acquisition system are connected by an optical fiber digital link. A central control of the system is possible by means of the control and data acquisition system and RF sensitive electrical components are located in a highly effective shielded manner in the examination room only.

In another aspect, the invention relates to a method of receiving a radio frequency signal from a magnetic resonance imaging receiver coil unit, the method being performed by a nuclear magnetic resonance imaging radio frequency receiver, the method comprising receiving an analogue nuclear magnetic resonance signal from the radio frequency receiver coil unit, converting the analogue magnetic resonance signal into a first digital signal, wherein the conversion is being performed by an analogue digital converter, resampling and demodulating the first digital signal into a second digital signal and communicating the second digital signal via a communication link, wherein the first clock generator generates a sampling clock, the sampling clock being a direct clock source for the analogue digital converter, the first clock generator generating the sampling clock using a digital timing reference and the digital timing reference being received digitally via the communication link by the communication interface. The system clock is generated by a second clock generator, the system clock being the direct clock source for the resampling and demodulation unit and a second clock generator is generating the system clock using the sampling clock.

In accordance with an embodiment of the invention, the method further comprises generating a data clock by a third clock generator, the data clock being the direct clock source for the communication interface, the third clock generator generating the data clock using the sampling clock or the system clock.

In accordance with an embodiment of the invention, the digital timing reference which is received digitally via the communication link is received as a serial data bitstream, wherein the data clock is a multi-phase clock, the method further comprising recovering by the communication interface the data clock from the multi-phase clock and recovering the data comprised in the serial data bitstream using the recovered data clock.

In another aspect, the invention relates to a computer program product comprising computer executable instructions to perform the method according to the invention.

BRIEF DESCRIPTION OF THE DRAWINGS

In the following preferred embodiments of the invention are described in greater detail by way of example only making reference to the drawings in which.

DETAILED DESCRIPTION

Figure 1:
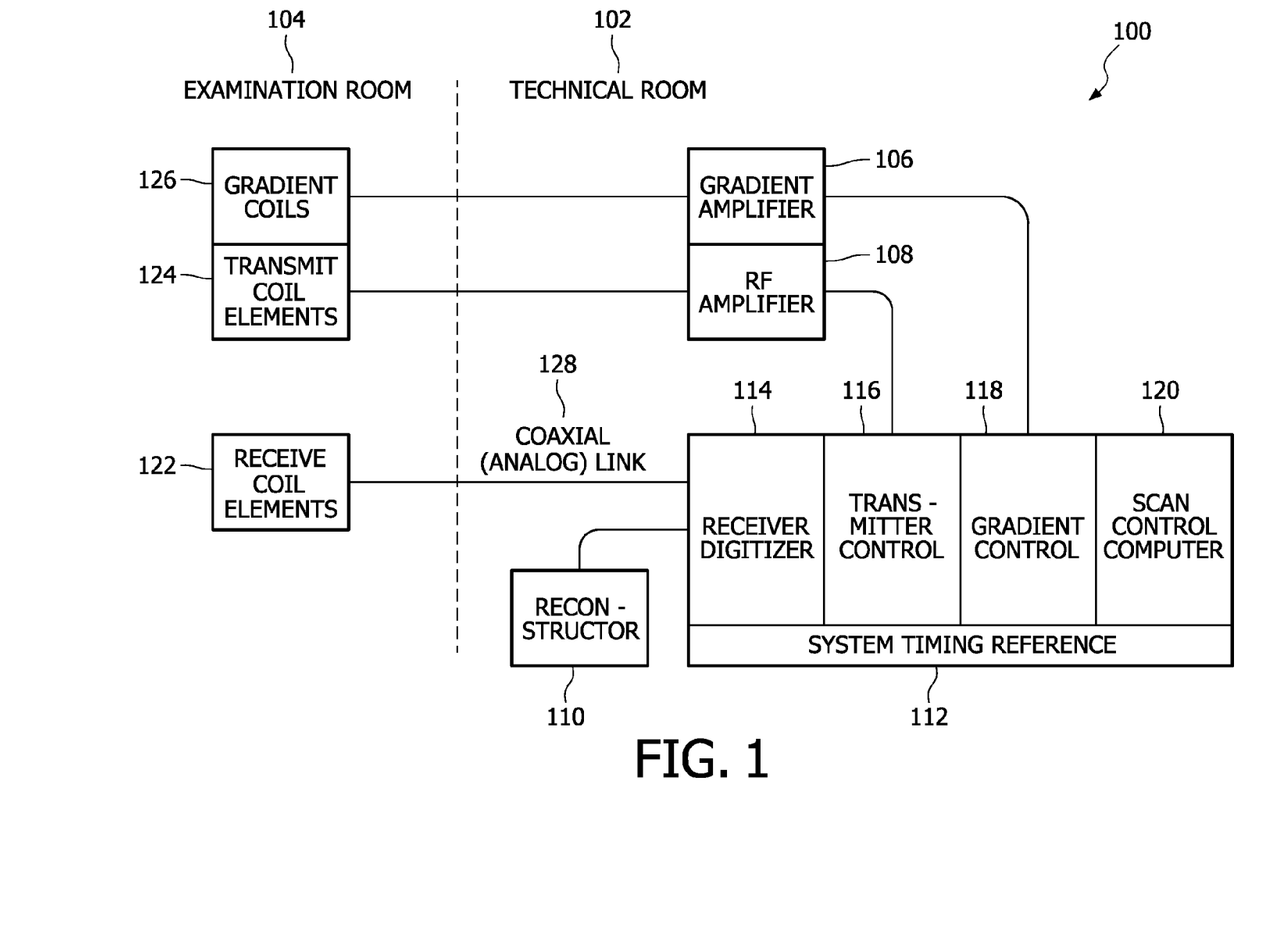
FIG. 1 illustrates a state of the art MRI system.

FIG. 1 illustrates a state of the art MRI system 100. The state of the art system is separated into two parts, the electrical components which are located in the examination room 104 and the electrical components which are located in the technical room 102. The reason for that separation is, that in the examination room the MRI magnet is located together with its gradient coils 126, its transmit coil elements 124 and the receive coil elements 122. For excitation of nuclei for MR imaging purposes, high frequency RF pulses have to be applied via the transmit coil elements 124 and detected by the receive coil elements 122. The shielding of the examination room ensures that a high quality reception of RF signals without strong disturbances is possible. This also requires a galvanic separation of the electrical components located in the examination room and the electrical components located in the technical room 102.

In the technical room, a gradient amplifier 106 and an RF amplifier 108 are located. Both amplifiers are necessary in order to provide enough energy to perform MRI scans by means of the gradient coils 126 and the transmit coil elements 124. The gradient amplifier 106 and the RF amplifier 108 is controlled by a control and data acquisition system which itself comprises a receiver with a digitizer 114, a transmitter control 116, a gradient control unit 118 and a scan control computer 120. Also, the receive coil elements 122 are connected via coaxial analogue links 128 to the control and data acquisition system. Also connected to the control and data acquisition is a reconstructor 110 which is used to reconstruct MRI images acquired by means of the receive coil elements 122.

The different parts that make up the MRI system (gradient waveform generators, transmit RF pulse generators, digitization part of the RF receivers) are all synchronized to a central, stable timing reference, the system timing reference 112. In the state of the art MRI system shown in FIG. 1, this reference is generated and distributed as a master clock to the various subsystems inside a rack housing all digital electronics.

The disadvantage of the system shown in FIG. 1 is, that for example between the examination room 104 and the technical room 102 typically electrical connections are required with a length of 10-20 meters. This provides a high error proneness due to the high possibility that external RF fields may couple to the wires in between the examination room and the technical room. Also, weak MR signals detected by the receive coil elements 122 are further damped by the long cables which decreases the sensitivity of the MRI system 100. Furthermore the cost and complexity associated with scaling to an increased number of receiver channels rise rapidly when implemented using analog connections to centralized receivers in the technical room.

Figure 2:
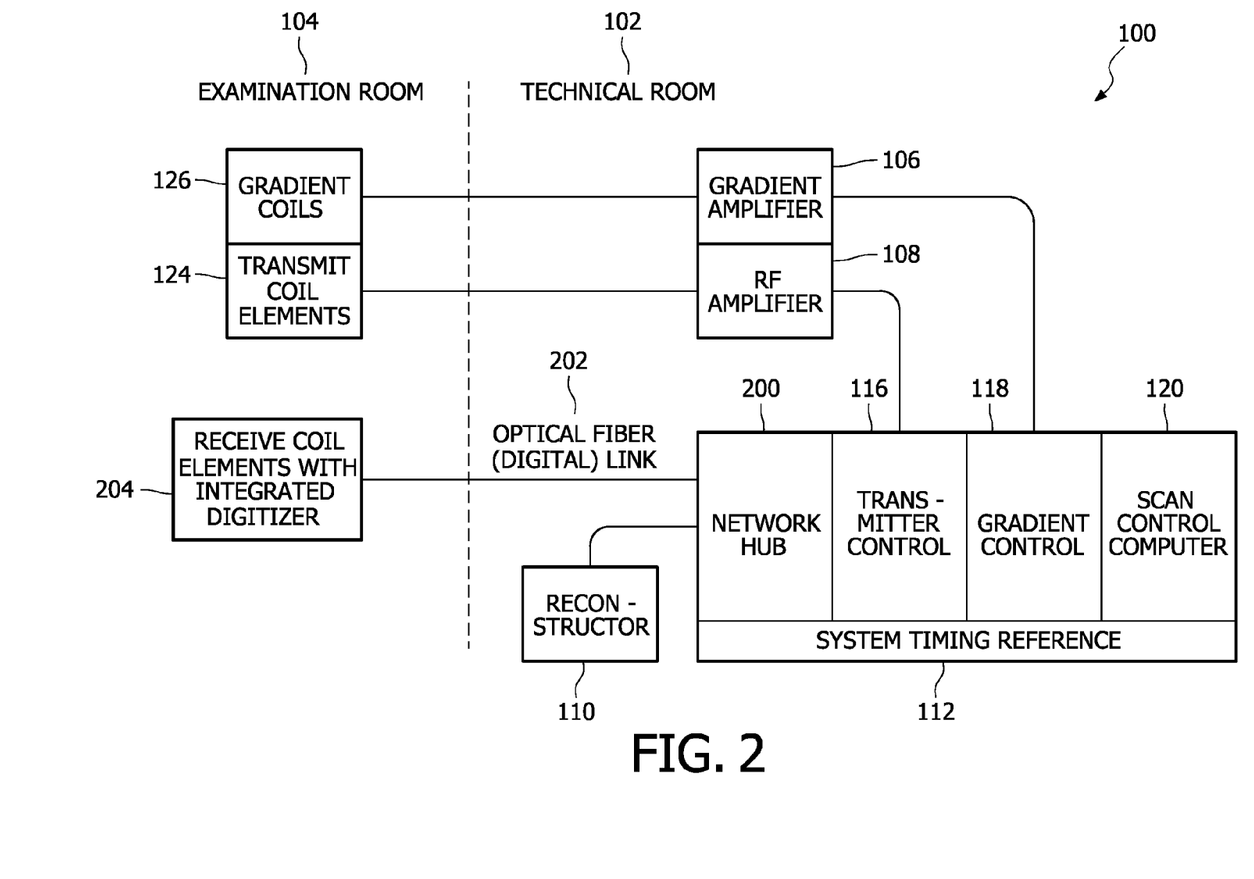
FIG. 2 illustrates an MRI system with a digital receiver integrated close to or inside the receive coil assembly.

The solution to these problems is shown in FIG. 2, which illustrates an MRI system with an integrated digital receiver. The difference though between FIG. 1 and FIG. 2 is, that in the MRI system 100 of FIG. 1 a digitization of an acquired MR signal is performed in the technical room 102 by means of the receiver and digitizer 114, whereas in FIG. 2 a digitization is already performed at the receive coil elements with integrated digitizer 204. This means, that the analogue connection 128 of the state of the art MR system between the receive coil assembly and the fixed system (electronics) in the technical room 102 is replaced by a digital optical fiber connection 202. This requires the presence of an additional network hub 200 in the technical room 102 which is able to receive the optical digital signals via the optical fiber link 202. However, this means that the timing information which in the state of the art system as well as in the digital system shown in FIG. 2 is generated by the system timing reference 112, needs to be transferred from the technical room 102 to the receive coil elements with integrated digitizer 204 in the examination room. The problem how the timing reference is provided to the receive coil elements with integrated digitizer 204 is that from an incoming digital datastream over the fiber link 202 the receive coil elements with integrated digitizer 204 reconstruct a clock. The incoming digital datastream over the fiber link 202 is locked in frequency to the system timing reference 112, the master clock.

Figure 3:
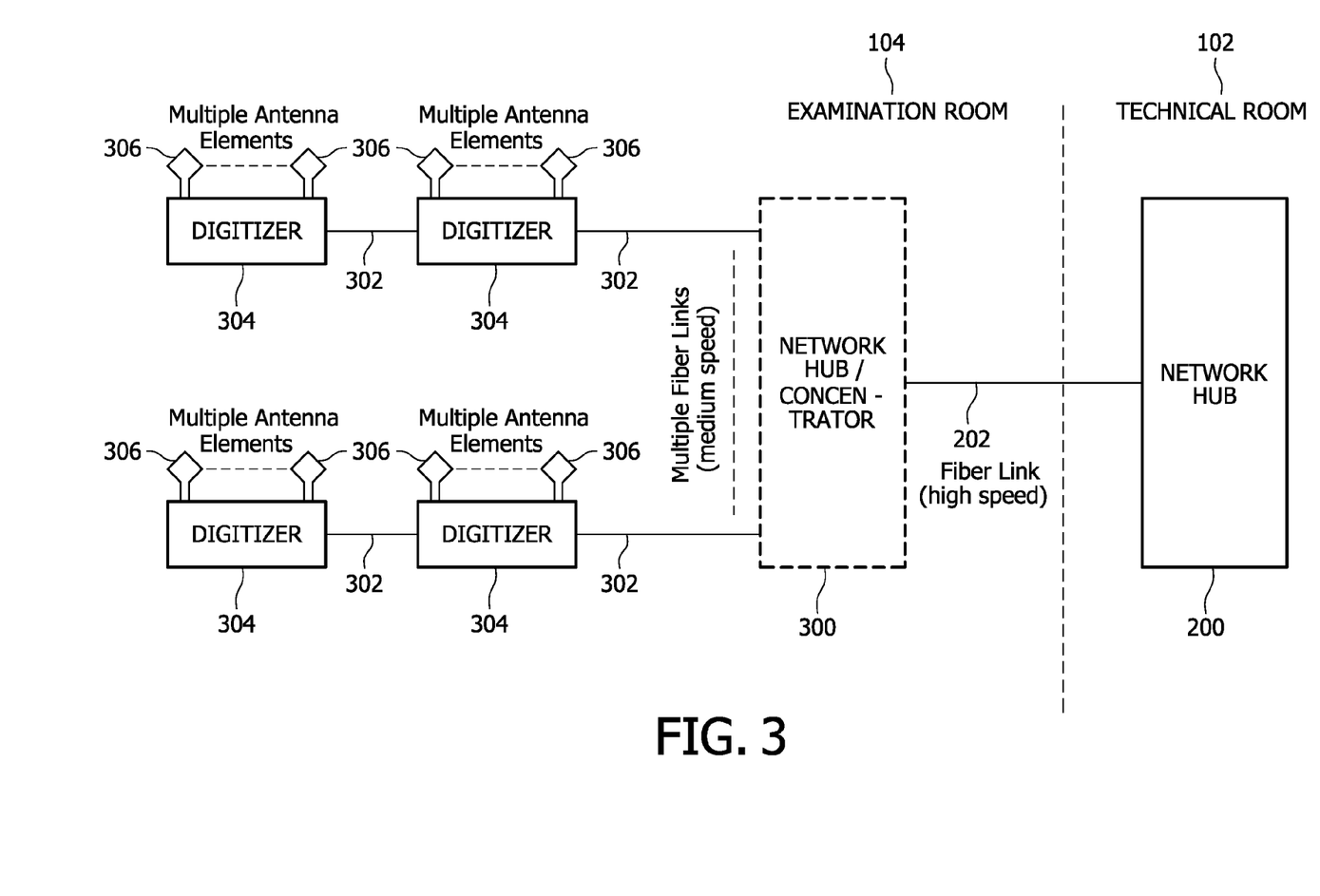
FIG. 3 illustrates multiple coil elements with integrated digitizers in an MRI system.

FIG. 3 illustrates multiple coil elements with integrated digitizers in an MRI system. The coil elements shown in FIG. 3 are daisy chained, wherein a further advantage of the usage of digital receivers becomes clear: since each receiver has its own digitizer, simple digital fiber links can be used to interconnect coil elements which on the one hand ensures an efficient galvanic decoupling of the coil elements and additionally provides an easy manner of interconnecting the elements without cable clutter etc.

In FIG. 3 is shown the network hub 200 which is located at the control and data acquisition system in the technical room 102. A further network hub 300 is located in the examination room 104, wherein the network hub 200 in the technical room 102 and the network hub 300 in the examination room 104 are connected by a high-speed fiber link 202. To the network hub 300 in the examination room 104, multiple coil elements with integrated digitizers are connected to by medium-speed fiber links 302. Each coil element comprises for example multiple antenna elements 306 and a digitizer 304. By means of the antenna element 306, RF signals are picked up after respective excitation pulse sequences which involve the gradient coils and transmit coil elements and the picked up RF signals are thereupon digitized by the digitizers 304.

As can be seen in FIG. 3, it is possible to connect multiple digitizers 304 directly to the network hub 300, which in this case also serves as a concentrator. Alternatively it is possible to daisy chain multiple digitizers 304, such that each digitizer has at least one input and one output for connection to further digitizers and the network hub.

A timing reference from the master clock of the control and data acquisition system is provided by means of the high-speed fiber link 202 and the network hub 300 to the individual coil elements with integrated digitizers 304. Preferably, each digitizer 304 reconstructs its system or sampling clock individually from the datastream over the respective medium-speed fiber links 302.

Figure 4:
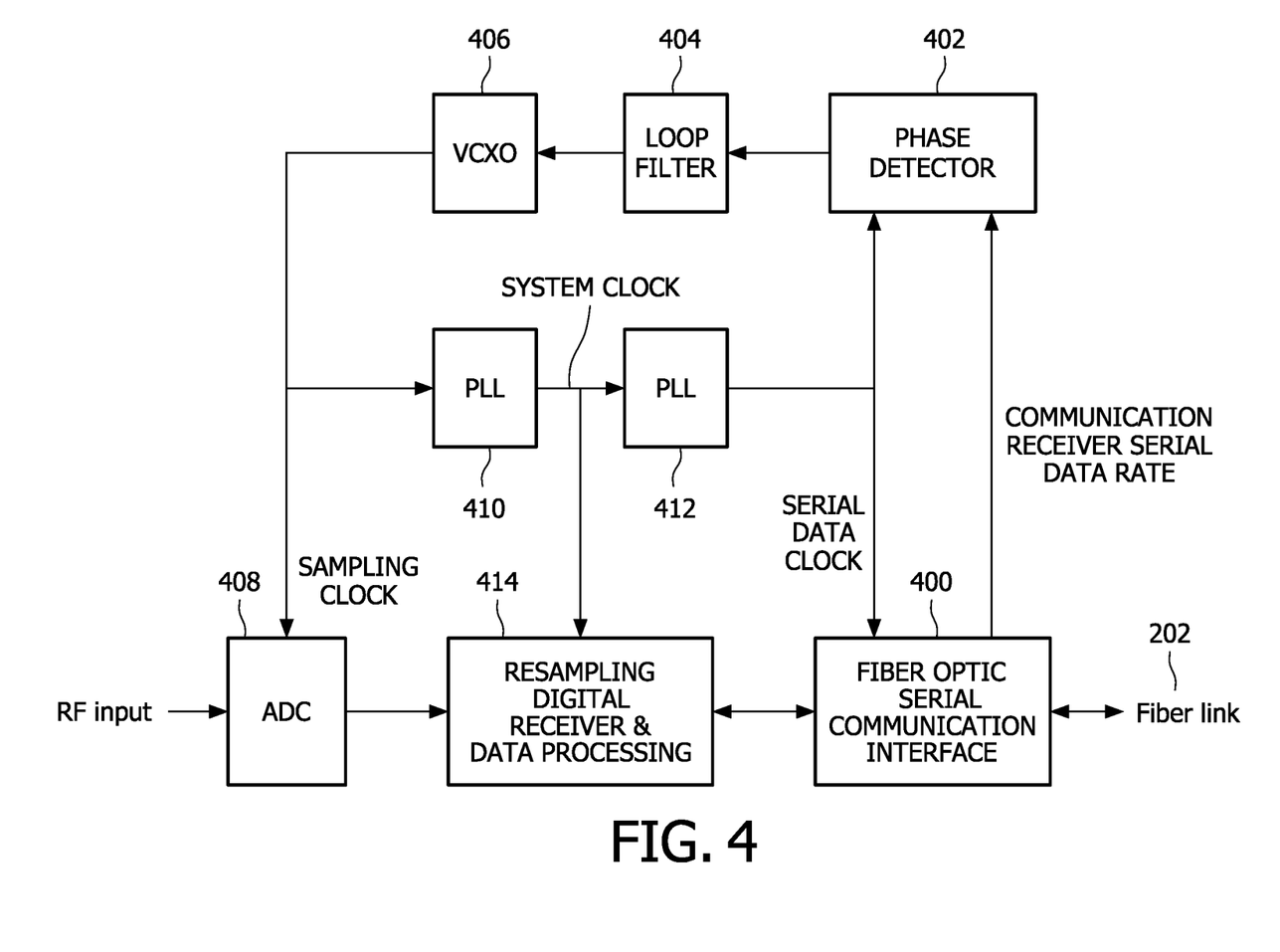
FIG. 4 shows an MRI receiver according to the invention.

FIG. 4 shows an MRI receiver according to the invention. The receiver in FIG. 4 is a digital receiver and comprises a fiber optic serial communication interface 400 which is connected by a fiber link 202 to a control and data acquisition system in a technical room not shown here. The fiber optic serial communication interface 400 is used in combination with the phase detector 402 and a loop filter 404, as well as a voltage controlled oscillator 406 to extract a sampling clock from the serial data rate of the data communication received by means of the fiber link 202. The sampling clock extracted from the receiver serial data rate is used to sample of RF signals incoming by means of an RF input to an analogue digital converter 408.

In order to generate a system clock which is used for resampling and digital demodulation purposes by the resampling and digital demodulation unit 414, a further PLL (phased locked loop) 410 is used to generate the system clock from the sampling clock. Such generated system clock can then be further used by a further PLL 412 to generate a serial data clock which is used for communications via the communication interface 400 and the fiber link 202. Thus, the phase detector 402, loop filter 404, VCXO 406, PLL 410 and PLL 412 form a loop which ensures a high stability with respect to the generated sampling clock. The quality of the ADC sampling clock with respect to jitter and phase noise specification is therewith only determined by the VCXO, the loop filter and the phase detector. Proper design of the loop filter and phase detector ensure that the quality of the VCXO component is the sole factor determining the phase noise and jitter of the sampling clock.

The approach shown in FIG. 4 uses the VCXO frequency directly as ADC sampling and derives a system clock from the ADC sampling clock using a PLL. The quality of the sampling clock only depends on the VCXO. This is a very important property, as ADC sampling clock quality is of prime importance for the quality of the acquired RF signal. Increased jitter of the system clock is much less critical than jitter on the sampling clock, because it concerns digital processing only.

Regarding the resampling and digital demodulation unit 414 for the sake of completeness it has to be mentioned, that the receiver makes use of the fact that the MR signal acquired by means of the RF input typically has a bandwidth which is much lower than the MR signal carrier frequency. For example, in a 1.5 T system for protons a carrier frequency of 64 MHz is used, which contains an MR signal bandwidth of approximately 2 MHz. Since it would be a waste in resources if a digitized 64 MHz signal would be transmitted via the fiber link 202 to the control and data acquisition system in the technical room, a resampling and digital demodulation is performed. In practice, the frequency of the sampling clock must be chosen carefully to avoid aliasing and to facilitate anti-aliasing band pass filter implementation.

Also by introducing the resampling function in between the analogue digital converter 408 and the digital demodulator allows choosing the sampling frequency of the ADC 408 independently of the frequency at which the demodulator and communication interface 400 operate. This independence provides additional design freedom in the analogue and digital domain.

Figure 5:
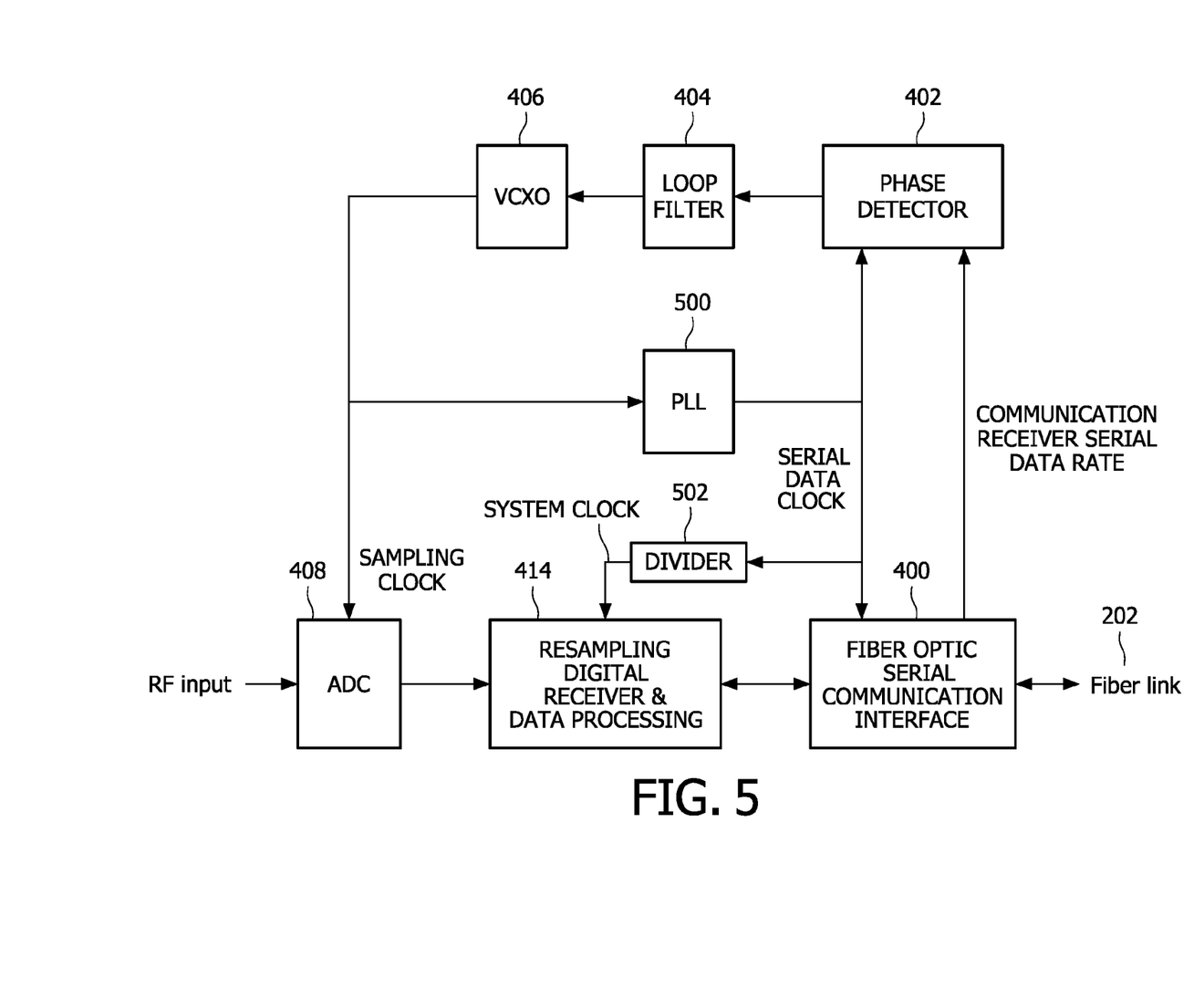
FIG. 5 shows a further embodiment of an MRI receiver according to the invention.

FIG. 5 shows a further embodiment of a digital MR receiver according to the invention. The difference between the MR receiver of FIG. 4 and the MR receiver of FIG. 5 is, that in FIG. 4 the sampling clock is first input to a PLL 410 to generate a system clock and the resulting system clock is then input into a further PLL 412 to generate a serial data clock. In the digital MR receiver shown in FIG. 5 only one PLL 500 is used to which the sampling clock is input. The PLL 500 generates from the sampling clock a serial data clock which is input to the phase detector 402 to provide a feedback loop. The serial data clock is further used by the communication interface 400 for communication of digitized MR signals to the control and data acquisition system over the fiber link 202. In order to generate the system clock which is needed by the resampling and digital demodulation unit 414, the serial data clock is input into a divider 502. This provides a further optimized MR receiver since only one PLL is used to generate the serial data clock and the system clock. The system clock is only derived from the serial data clock by a simple division. Depending on the implementation technology like for example an ASIC integration and used clock ratios, such an approach as shown in FIG. 5 may be more efficient.

Not shown in the FIGS. 4 and 5 is an independent data recovery circuit which takes care of proper sampling of data bits received by the fiber link 202. This means, that the circuit shown in FIGS. 4 and 5 is used to obtain a clock that has a frequency lock with the datastream received by the optical fiber 202 and as such has a frequency lock with a reference master clock with which the datastream was generated.

The reason for not combining a data clock recovery circuit with the sampling and system clock recovery circuit are, that the serial data recovery circuit may also deliver a 'recovered clock' which however may contain phase jumps which would adversely affect the ADC sampling clock quality. Also it is highly desired to have daisy chain receiver modules either one on one or in star topology, which means that multiple serial data recovery units for communication in each module, each with a different data phase are required. Using a VCXO for recovery of each of these datastreams would be prohibitive in cost, size and power consumption.

Figure 6:
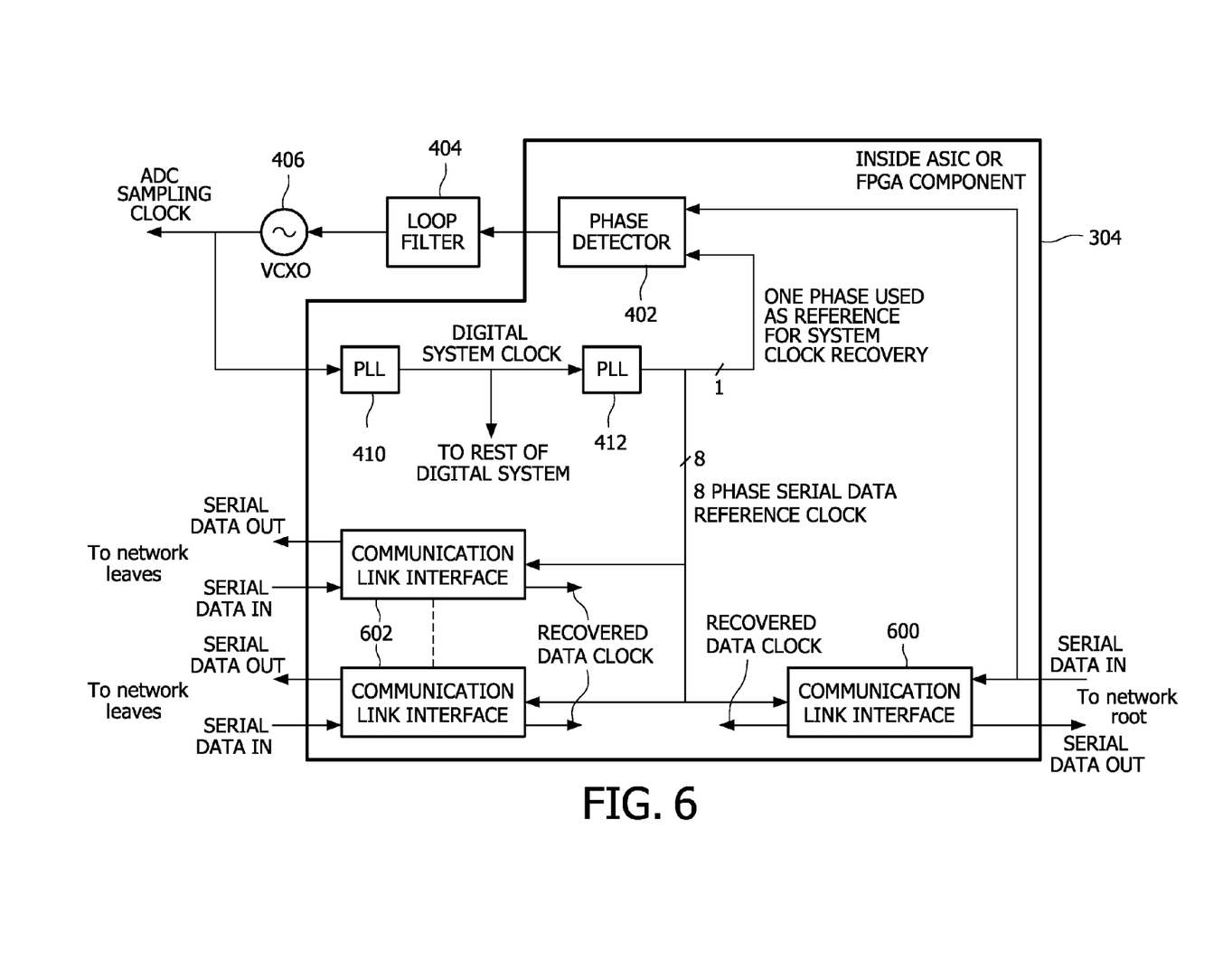
FIG. 6 illustrates further details of the clock recovery system.

FIG. 6 illustrates details related to the independence of system versus data clock recovery. Important in FIG. 6 is the data clock recovery of the communication link. Compared to FIG. 4, the PLL 412 is adapted to generate an eight phase clock at or around the frequency of the serial data rate which is received by means of the communication link interface 600. One of these phases is used as a reference for the system clock recovery and therewith input again into the phase detector 402 which means, that by using this one phase a feedback loop comprising the phase detector, loop filter, VCXO and the PLLs 410 and 412 is provided.

At each communication link interface a recovered data clock is derived from the eight phase local reference clock which is output from the PLL 412. The recovered data clock can then be used to recover the data comprised in the datastream which is input to the communication link interface 600. The data recovery will work even if the local reference clock is not frequency locked to the data rate. In this case, determining the correct phase for data reception is a dynamic process and therefore the recovered clock contains phase jumps of ⅛× serial data period. The data is then 'deserialized' and the clock divided accordingly. This results in the recovered data clock as shown in FIG. 6.

The main reason why the recovered data clock is not used as a reference for the system phase detector is as already mentioned above, that the clock may contain jumps resulting from the dynamic phase selection. These jumps can be of very low frequency and therefore will not be filtered out by the loop filter. Since this would result in unacceptable phase jumps of the ADC sampling clock, the determination of the recovered data clock used to recover data encoded into the data stream and the determination of the ADC sampling clock are separated from each other. The ADC sampling clock does not depend on the recovered data clock.

Also shown in FIG. 6 are further communication link interfaces 602 which can be used to daisy chain further digital receivers. Each communication link 602 performs data recovery independently. This means, that each data recovery circuit of each receiver is individually able to perform a communication with a subsequent digital receiver.

Figure 7:
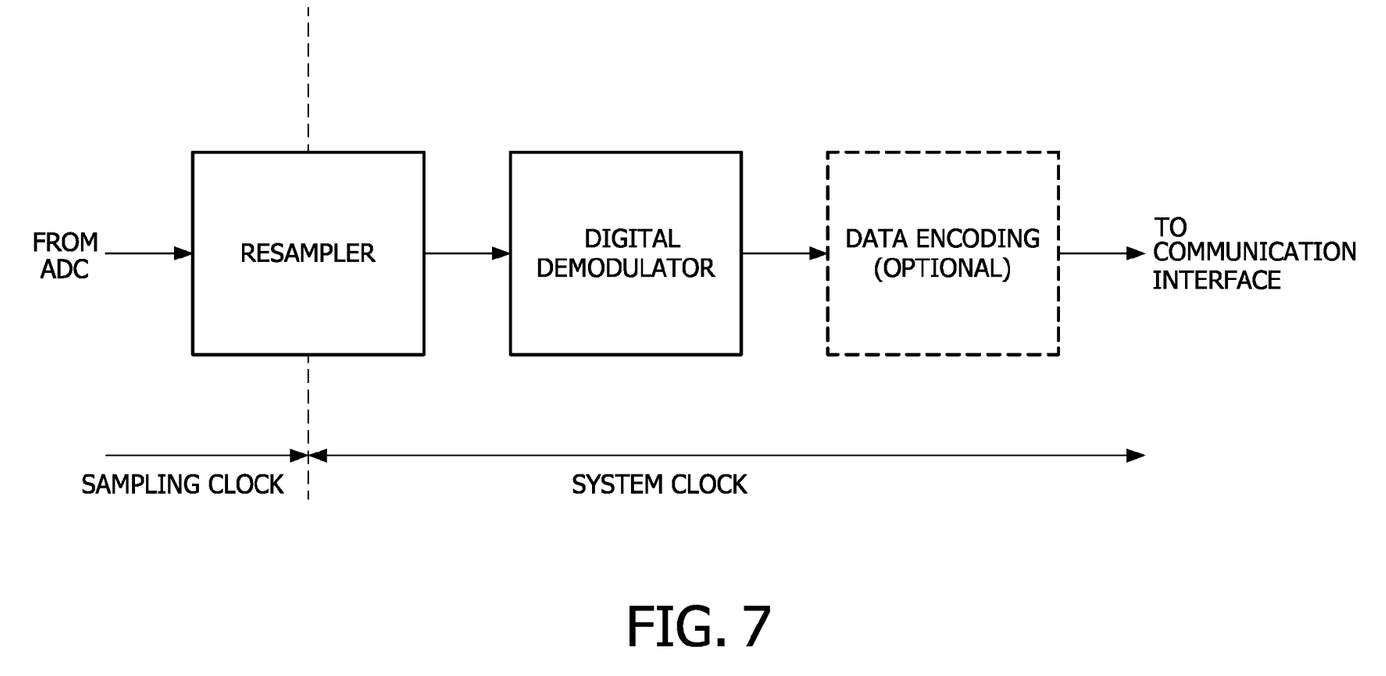
FIG. 7 illustrates a block diagram of a data flow from the ADC to the communication interface.

FIG. 7 illustrates a block diagram of a data flow from the ADC to the communication interface. This flow typically takes place within the resampling and digital demodulation unit and comprises three main steps: first the data received from the ADC is input into the resampler, resampled and thereupon input into the digital demodulator. Finally, the signal processed by the demodulator is further processed and encoded and provided to the communication interface. As already mentioned above, the resampling is optional. The same holds for the additional encoding. However, the demodulator is required in order to reduce the data bandwidth significantly to allow for an efficient transport of the data over an optical digital network). A further purpose of the demodulator is to deliver base band data which is used for image reconstruction purposes.

LIST OF REFERENCE NUMERALS

100 MRI system
102 technical room
104 examination room
106 gradient amplifier
108 RF amplifier
110 reconstructor
112 master clock
114 digitizer
116 transmitter control
118 gradient control
120 scan control
122 analogue receive coil
124 transmit coil
126 gradient coil
128 analogue link
200 network hub
202 digital link
204 digital receive coil
300 network hub
302 link
304 digitizer
306 antenna element
400 communication interface
402 phase detector
404 loop filter
406 VCXO
408 ADC
410 PLL
412 PLL
414 Resampling and digital demodulation unit
500 PLL
502 divider
600 communication interface
602 communication interface

The invention claimed is:

1. A radio frequency receiver for receiving analogue signals from at least one radio frequency receiver coil unit of a nuclear magnetic resonance imaging (MRI) system, the radio frequency receiver being integrated with the radio frequency receiver coil unit within an examination room, the radio frequency receiver comprising:
an analogue-digital converter configured to convert the received analogue signals into a first digital signal;
a resampling and digital demodulation unit configured to convert the first digital signal into a second digital signal;
a communication interface configured to send the second digital signal to a control and data acquisition system via a communication link;
a first clock generator configured to generate a sampling clock for clocking the analogue-digital converter using a digital timing reference from a master clock in the control and data acquisition system, the digital timing reference being received in a datastream by the communication interface via the communication link; and
a second clock generator configured to generate a system clock for clocking the resampling and demodulation unit, the system clock being derived from the sampling clock.

2. The receiver as claimed in claim 1, further comprising:
a third clock generator configured to generate a data clock for clocking the communication interface, the third clock being derived from one of the sampling clock or the system clock.

3. The receiver as claimed in claim 2, wherein the first clock generator and the third clock generator form a feedback loop, and wherein the first clock generator is controlled by the feedback loop.

4. The receiver as claimed in claim 3, wherein the second clock generator is comprised in the feedback loop.

5. The receiver as claimed in claim 3, wherein the feedback loop is a phase locked loop.

6. The receiver as claimed in claim 2, wherein the data clock is a multi phase clock, wherein the communication interface is further configured to perform a recovery of the data clock from the multi-phase clock, and wherein the recovered data clock is usable to recover data in the datastream.

7. The receiver as claimed in claim 2, further comprising:
at least one additional communication interface, providing multiple communication interfaces, the multiple communication interfaces being configured for daisy-chaining of further receivers.

8. The receiver as claimed in claim 7, wherein each communication interface individually and dynamically recovers the data clock from a centrally generated multi phase clock.

9. The receiver as claimed in claim 1, wherein the digital timing reference which is received digitally via the communication link is received as a serial data bitstream.

10. The receiver as claimed in claim 1, further comprising:
a plurality of receiver channels, one receiver channel comprising the analogue-digital converter and the resampling and digital demodulation unit,
wherein the sampling clock, the system clock and the communication interface are common to the plurality of receiver channels.

11. The receiver as claimed in claim 1, wherein the system clock and the sampling clock run at the same frequency.

12. The receiver as claimed in claim 1, wherein the control and data acquisition system is located within a technical room remote from the examination room.

13. A method of receiving a radio frequency signal from a magnetic resonance imaging receiver coil unit at a nuclear magnetic resonance imaging radio frequency receiver integrated with the receiver coil unit, the method comprising:
receiving an analogue nuclear magnetic resonance signal from the radio frequency receiver coil unit;
converting the analogue magnetic resonance signal into a first digital signal using an analogue-digital converter;
receiving a digital timing reference from a master clock in a control and data acquisition system via a communication link using a communication interface;
generating a sampling a clock for clocking the analogue-digital converter using the digital timing reference and data acquisition system;
resampling the first digital signal into a second digital signal using a resampling and digital demodulation unit, and communicating the second digital signal to the control and data acquisition system via the communication link; and deriving a system clock from the sampling clock for clocking the resampling and demodulation unit.

14. The method as claimed in claim 13, further comprising:
deriving a data clock from one of the sampling clock and the system clock for clocking the communication interface.

15. The method as claimed in claim 14, wherein the digital timing reference is received as a serial data bitstream, and wherein the data clock is a multi-phase clock, the method further comprising:
recovering by the communication interface the data clock from the multi-phase clock and recovering the data comprised in the serial data bitstream using the recovered data clock.

16. A non-transitory computer program product comprising computer executable instructions to perform any of the method steps as claimed in claim 13.

\* \* \* \* \*